(12) United States Patent
Barrenscheen

(10) Patent No.: US 8,258,655 B2
(45) Date of Patent: Sep. 4, 2012

(54) CIRCUIT ARRANGEMENT AND METHOD FOR DRIVING A LOAD

(75) Inventor: Jens Barrenscheen, Munich (DE)

(73) Assignee: Infineon Technologies Austria AG, Villach (AT)

( * ) Notice: Subject to any disclaimer, the term of this patent is extended or adjusted under 35 U.S.C. 154(b) by 350 days.

(21) Appl. No.: 12/705,893

(22) Filed: Feb. 15, 2010

(65) Prior Publication Data

US 2011/0199071 A1 Aug. 18, 2011

(51) Int. Cl.
*F16P 3/20* (2006.01)
(52) U.S. Cl. ....................................... 307/328
(58) Field of Classification Search ............... 307/328
See application file for complete search history.

(56) References Cited

OTHER PUBLICATIONS

International Electrotechnical Commission, "Ajustable Speed Electrical Power Drive Systems—Part 5-2: Safety Requirements—Functional," IEC International Standard 61800-5-2, First Edition, Jul. 2007, 10 pages.

*Primary Examiner* — Robert L. Deberadinis
(74) *Attorney, Agent, or Firm* — Slater & Matsil, L.L.P.

(57) ABSTRACT

A circuit arrangement includes a drive circuit is adapted to generate a drive signal at the output dependent on a signal received at a control input, and dependent on a signal received at the first enable input. A first supply voltage circuit is adapted to provide a first supply voltage at output terminals, the output terminals being coupled to the supply terminals of the drive circuit. A second supply voltage circuit adapted to provide a second supply voltage at output terminals, the output terminals being coupled to the supply terminals of the drive circuit. The second supply voltage circuit has a second enable input, and is adapted to generate the second supply voltage dependent on a signal received at the second enable input.

10 Claims, 3 Drawing Sheets

CIRCUIT ARRANGEMENT AND METHOD FOR DRIVING A LOAD

TECHNICAL FIELD

Embodiments of the present invention relate to driving a load, and, in particular, to driving a transistor.

BACKGROUND

Transistors, such as MOS transistors, IGBTs, or bipolar transistors, are widely used as switches in industrial or automotive applications for switching electrical loads. A transistor can be switched on or off using a drive circuit that receives a control signal, where the control signal determines the desired switching state of the transistor. In so-called SIL (Safety Integrity Level) applications, drive circuits for driving transistors need to meet specific safety requirements that ensure that the switching state of the transistors definitely corresponds to the desired switching state given by the control signal. This provides for secure switching of electrical loads, such as electric motors, lamps, etc. Thus, an unintended switching-on of the load is prevented, and the load is definitely switched off, if required by a user or by a control circuit.

SUMMARY OF THE INVENTION

A first embodiment relates to a circuit arrangement that includes: a first control input for receiving a control signal. A drive circuit has a second control input, an output, supply terminals, and a first enable input. A first supply voltage circuit is adapted to provide a first supply voltage at output terminals that are coupled to the supply terminals of the drive circuit. A second supply voltage circuit is adapted to provide a second supply voltage at output terminals that are coupled to the supply terminals of the drive circuit. The second supply voltage circuit has a second enable input and is adapted to generate the second supply voltage dependent on a signal received at the second enable input. The drive circuit is adapted to generate a drive signal at the output dependent on a signal received at the second control input and dependent on a signal received at the first enable input. The first enable input of the second supply voltage circuit is adapted to receive a signal that is dependent on the control signal, and the second enable input of the drive circuit is adapted to receive a signal that is dependent on the second supply voltage. The control input of the drive circuit is adapted to receive a signal that is dependent on the control signal.

A second embodiment relates to a method of driving a load. The method includes providing a drive circuit and a first supply voltage to the drive circuit using a first supply voltage circuit. A second supply voltage is provided to the drive circuit using a second supply voltage circuit. The load is driven using the drive circuit dependent on a control signal and dependent on a voltage value of the second supply voltage.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

Figure 1:
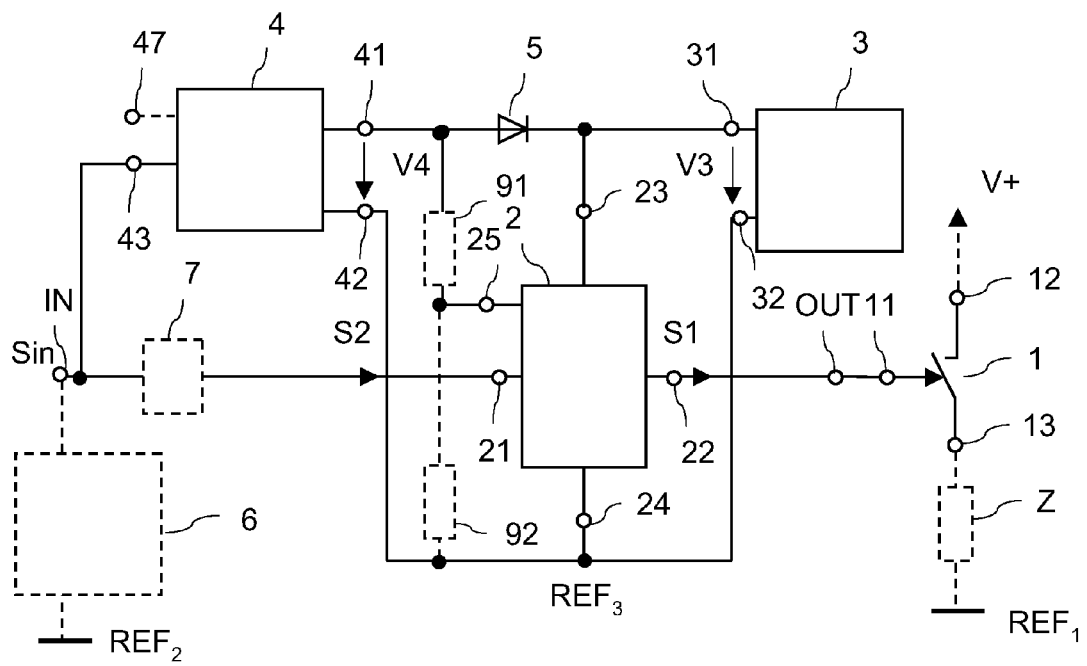
FIG. 1 illustrates a first embodiment of a circuit arrangement having a drive circuit, and first and second supply voltage circuits.

FIG. 1 illustrates a first embodiment of a circuit arrangement for driving a load. The circuit arrangement includes an input terminal IN for receiving an input or control signal Sin, and an output terminal OUT for connecting a load thereto and for providing a drive signal S1 to the load. A load that is driven by the circuit arrangement is, for example, an electrical switch, such as an MOS transistor, an IGBT, or a bipolar transistor. For illustration purposes a switch 1 is schematically illustrated in FIG. 1. Switch 1 has a control terminal 11 for receiving the drive signal 51, and first and second load terminals 12, 13. Switch 1 has a load path that extends between the load terminals 12, 13. Switch 1 can be implemented as an MOS transistor, such as a MOSFET or an IGBT, where in this case a gate terminal of the MOS transistor forms the control terminal 11, and drain and source terminals of the MOS transistor form the load terminals 12, 13. Further, switch 1 could be implemented as a bipolar transistor, where in this case a base terminal of the bipolar transistor forms the control terminal 11, and collector and emitter terminals form the load terminals 12, 13.

Switch 1 can be used to switch an electrical load Z (shown in dashed lines), such as a motor or a lamp. In this case switch 1 is connected in series with the load Z, with the series circuit being connected between voltage supply terminals. In the embodiment illustrated in FIG. 1 switch 1 is connected in a high-side configuration, which is a configuration in which the load path is connected between the load Z and a terminal for a positive supply potential V+, while the load Z is connected between the switch 1 and a terminal for a negative supply potential or a first reference potential $REF_1$. It should be mentioned that this is only an example. Switch 1 could also be connected in a low-side-configuration, which is a configuration in which the switch 1 is connected between the terminal for the first reference potential $REF_1$ and the load Z. As will be explained further below, switch 1 could also be part of a half-bridge circuit, which is a circuit that has two switches connected in series between supply terminals.

Referring to FIG. 1, the circuit arrangement includes a drive circuit 2 having a control input 21 coupled to the input IN, and adapted to receive a control signal S2 that is dependent on the control signal Sin that is received at the input IN. The control signal S2 received by the drive circuit 2 will be referred to as second control signal in the following. Drive circuit 2 further includes an output 22 that is connected to the output OUT of the circuit arrangement, and that is adapted to provide the drive signal 51. Further, the drive circuit 2 includes first and second supply terminals 23, 24 for receiving a supply voltage, and a first enable input 25 for receiving an enable signal.

Drive circuit 2 is adapted to generate the drive signal 51 dependent on the control signal S2 received at its control input 21, and is adapted to generate the drive signal 51 also dependent on the enable signal received at the first enable input 25.

Referring to FIG. 1, the circuit arrangement further includes a first supply voltage circuit 3 that has first and second output terminals 31, 32, and that is adapted to provide a first supply voltage V3 at output terminals 31, 32. The output terminals 31, 32 of the first supply voltage circuit 3 are coupled to the supply terminals 23, 24 of the drive circuit 2, where in the present case the first output terminal 31 of the first supply voltage circuit 3 is coupled to the first supply terminals 23 of the drive circuit, and the second output terminal 32 of the first supply voltage circuit 3 is coupled to the second supply terminal 24 of the drive circuit 2. A second supply voltage circuit 4 provides a second supply voltage V4 at output terminals 41, 42, where the output terminals 41, 42 of the second supply voltage circuit 4 are also coupled to the supply terminals 23, 24 of the drive circuit 2. A first output terminal 41 of the second supply voltage circuit 4 is coupled to the first supply terminal 23 of the drive circuit 2, and the second output terminal 42 of the second supply voltage circuit 4 is coupled to the second supply terminal 24 of the drive circuit 2. Optionally a decoupling element 5, such as a diode, is connected between one of the output terminals of one of the voltage supply circuits 3, 4 and one of the supply terminals 23, 24 of the drive circuit 2. In the embodiment illustrated in FIG. 1, a decoupling element 5 that is implemented as a diode is connected between the first output terminal 41 of the second supply voltage circuit 4 and the first supply terminal 23 of the drive circuit 2. The decoupling element 5 decouples first output terminal 41 of the second supply voltage circuit 4 from the first output terminal 31 of the first supply voltage circuit 3.

In the embodiment according to FIG. 1, the enable input 25 of the drive circuit 2 is connected to the first output terminal 41 of the second supply voltage circuit 4 and, therefore, receives the second supply voltage V4 as the enable signal. In this embodiment decoupling element 5 further helps to prevent the first output voltage V3 of the first supply voltage circuit 3 from influencing the electrical potential at the enable input 25 of the drive circuit 2 and, therefore, ensures that the enable signal received at the enable input 25 is only dependent on the second supply voltage V4.

The second supply voltage circuit 4 includes a second enable input 43 that receives the control signal Sin or a signal that is dependent on the control signal Sin. Second supply voltage circuit 4 is adapted to generate the supply voltage V4 dependent on the signal received at its enable input 43. For illustration purposes it may be assumed that the output voltage V4 can assume one of at least two voltage levels: an enable level, or a disable level. The enable level corresponds, for example, to a maximum voltage the second supply voltage circuit 4 can provide. The disable level corresponds, for example, to a minimum voltage, such a zero, the second supply voltage circuit 4 can provide. The second supply voltage circuit 4 provides electrical energy to the drive circuit 2 when the second supply voltage V4 assumes the enable level.

The circuit arrangement includes two independent signal transmission paths for transmitting the switching information contained in the control signal Sin to the drive circuit: a first transmission path between the input terminal IN and the control input 21 of the drive circuit 2; and a second transmission path from the input terminal IN via the second supply voltage circuit 4 to the enable input 25 of the drive circuit 2. Due to the presence of two independent signal transmission paths the circuit arrangement includes a redundancy so that even if one of the signal transmission paths fails secure switching of the switch 1, in particular, secure switching-off of the switch 1, is ensured.

The operating principle of the circuit arrangement of FIG. 1 will now be explained. For explanation purposes it is assumed that the control signal Sin received at the input IN is a signal that can assume two different signal levels that indicate a desired switching state of switch 1: a first signal level, which will be referred to as on-level in the following; and a second signal level, which will be referred to as off-level in the following. The control signal Sin determines a desired signal level of the drive signal 51, and thus determines a desired switching state of switch 1. A signal level of the drive signal 51 that switches switch 1 on will be referred to as on-level in the following, and a signal level of the drive signal 51 that switches switch 1 off will be referred to as off-level in the following. The on-level of the control signal Sin indicates that a desired signal level of the drive signal S1 is an on-level, which is equivalent to the desired switching state of the switch 1 being in the switched-on state. The off-level of the control signal Sin indicates that the desired signal level of the drive signal S1 is the off-level, which is equivalent to the desired switching state of the switch 1 being in the switch-off state.

Control signal Sin is, for example, provided by a control circuit 6 (shown in dashed lines), such as, for example, a microcontroller. The control signal Sin is, for example, a logic signal having a signal range between 0V and 5V, or 0V and 3.3V. The on-level of the control signal Sin is, for example, a high voltage level, such as 5V or 3.3V, while the off-level is zero. However, this is only an example, other signal values may be used as well. Control signal Sin is, for example, a voltage signal that is related to a second reference potential $REF_2$. The first and second reference potentials $REF_1$, $REF_2$ can be the same potentials. However, according to an embodiment that will be explained hereinbelow the first and second reference potentials $REF_1$, $REF_2$ could also be different potentials.

It should be mentioned that the signal values representing the on-levels of the control signal Sin and the drive signal S1 may be different, and that signal values representing the off-levels of the control signal Sin and the drive signal S1 may be different. The on-level and off-level of the drive signal S1 are, dependent on the type of switch, selected such that the on-level of the drive signal S1 is suitable for switching on switch 1, and the off-level of drive signal S1 is suitable for switching off switch 1.

The control circuit 6, that generates the control signal Sin, and the drive circuit 2 can be circuits in different voltage domains. Further, a voltage domain of the load circuit, that includes the switching element 1 and the load, can be different from the voltage domains of the control circuit 6 and the drive circuit 2. A voltage domain is defined by a reference potential to which voltages occurring in the voltage domain are related to. A reference potential of the voltage domain of the control circuit 6 is, for example, the second reference potential $REF_2$, while the reference potential of the voltage domain of the drive circuit 2 is, for example, the potential at the second supply terminal 24 of the drive circuit 2, which will be referred to as third reference potential $REF_3$ in the following. It should be mentioned in this connection that the reference potentials of the different voltage domains may be either fixed potentials, or varying potentials. According to an embodiment, the first and second reference potentials $REF_1$, $REF_2$ are fixed potentials, while the third reference potential $REF_3$ is a variable potential.

If the control signal Sin and the drive signal S1 are signals or voltages, respectively, of different voltage domains an optional coupling circuit 7 is connected between the input IN and the control input 21 of the drive circuit 2. Coupling circuit 7 is, for example, a level shifter, an opto-coupler or a transformer that "transmits" the control signal Sin from the first voltage domain into the second voltage domain via a potential barrier present between these two voltage domains. When a coupling circuit 7 is present, the second control signal S2 is different from the control signal Sin at input IN, which means that signal levels of these signals are different. However, the switching information included in control signal Sin is also included in the second control signal S2.

The second supply voltage circuit 4 is adapted to generate the enable level of the second supply voltage V4 when the control signal Sin assumes the on-level, and to generate the disable level of the second supply voltage V4 when the control signal Sin assumes an off-level. Drive circuit 2 is adapted to drive switch 1 in its on-state only when the control signal S2 received at the control input 21 of the drive circuit 2 assumes an on-level, and when the second supply voltage V4 assumes an enable level. The control signal S2 received at the control input of the drive circuit 2 corresponds to the control signal Sin or is a level-shifted version of the control signal Sin, where an on-level of the second control signal S2 indicates that the switch 1 is to be driven in its on-state, while an off-level of the second control signal S2 indicates that the switch 1 is to be driven in its off-state. An enable level of the second supply voltage V4 indicates that switch 1 is to be driven in its on-state, while, a disable level indicates that switch 1 is to be driven in its off-state.

If only one of the control signal S2 or the second supply voltage V4 has a signal level indicating that switch 1 is to be driven in its off-state, then drive circuit 2 switches switch 1 off. Thus, a failure in generating one of the control signal S2 or the supply voltage V4 would still result in switch 1 being securely switched off.

In the embodiment illustrated in FIG. 1 the enable signal received at the enable input 25 of the drive circuit 2 is the second output voltage. However, this is only an example. Instead of the second supply voltage V4 being a signal that is dependent on the second supply voltage V4 can be used as an enable signal as well. Such a signal can, for example, be generated using a voltage divider 91, 92 (shown in dashed lines in FIG. 1) having two resistances connected in series between the output terminals 41, 42, where the enable signal is available at a tap of the voltage divider.

Besides the redundancy in transmitting the control signal Sin to the drive circuit 2 there is a further redundancy in the circuit arrangement in that it includes two supply voltage sources, namely the first and second supply voltage circuits 3, 4. In case a failure occurs in the first supply voltage circuit 3, proper voltage supply of the drive circuit 2 is safe-guarded by the second supply voltage circuit 4.

Figure 2:
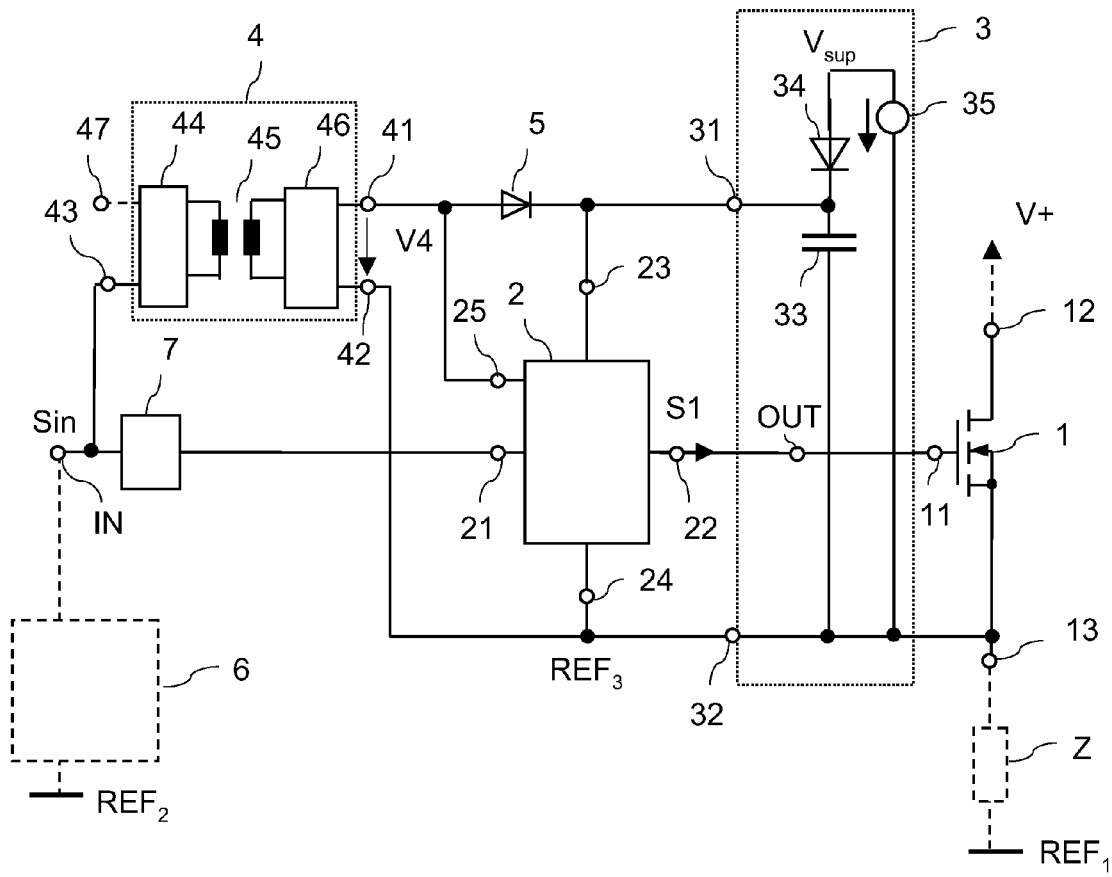
FIG. 2 illustrates detailed embodiments of the first and second supply voltage circuits in detail.

FIG. 2 illustrates embodiments of the first and second supply voltage circuits 3, 4 in detail. The first supply voltage circuit 3 according to this embodiment includes a bootstrap-circuit that includes a capacitive storage element 33, such as a capacitor, connected between the output terminals 31, 32, and a rectifier element 34, such as a diode, connected between a terminal for an auxiliary supply potential $V_{sup}$ and one terminal of the capacitive storage element 33. The auxiliary supply voltage $V_{sup}$ is, for example, provided by a voltage source 35 connected between the series circuit with the capacitive storage element 33 and the rectifier element 34. The supply voltage $V_{sup}$ provided by the voltage source 35 is a voltage that is related to the third reference potential $REF_3$.

In the embodiment according to FIG. 2 the rectifier element 34 is connected to the terminal of the capacitive storage element 33 that is connected to the first output terminal 31. Bootstrap circuits, such as bootstrap circuit 33, 34 illustrated in FIG. 2, are, in particular, useful in supplying drive circuits 2, that are used for driving MOS transistors connected in a high-side configuration. For illustration purposes, switch 1 according to FIG. 2 is implemented as a MOS-transistor, in particular, a n-MOSFET, that has a gate terminal forming the control terminal 11 and having drain and source terminals forming the first and second load terminals 12, 13. MOSFETs are voltage-controlled switches that switch on and off dependent on a gate-source voltage applied between their gate and source terminals. For driving the MOSFET 1, drive circuit 2 provides a voltage signal that is related to the source potential, i.e., the electrical potential at the source terminal 13 of the MOSFET 1. For this, the second supply terminal 24 of the drive circuit 2 is connected to the second load terminal 13 of the MOSFET 1.

In the circuit arrangement of FIG. 2 the control circuit 6 and the drive circuit 2 are circuits of different voltage domains. While the control signal Sin provided by the control circuit 6 is related to the first reference potential, which is a fixed potential, such as ground GND, the output signal 51 provided by the drive circuit 2 is related to the third reference potential $REF_3$. In the present example the third reference potential $REF_3$ is the potential at the source terminal 13 of the MOSFET 1. This source potential is a varying potential that is dependent on the switching state of the MOSFET 1.

In a configuration in which MOSFET 1 is connected in series with a load Z between a terminal for a positive supply potential V+ and a terminal for a negative supply potential or reference potential, such as the first reference potential $REF_1$, the electrical potential at the source terminal 13 may vary in a range between the positive and the negative supply potential. The source potential is approximately equivalent to the positive supply potential V+ when MOSFET 1 is switched on, and the source potential is approximately equivalent to the negative supply potential $REF_2$ when MOSFET 1 is switched off.

Bootstrap circuit 33, 34 and MOSFET 1 act as a charge pump. When MOSFET 1 is switched off and, thus, the source potential is equivalent to the negative supply potential, then the capacitive storage element 33 is charged from the terminal for the auxiliary supply potential $V_{sup}$ via diode 34. The drive circuit 2 can use the electrical energy stored in the capacitive storage element 33 for switching on MOSFET 1. When switching MOSFET 1 on, the source potential rises to the upper supply potential V+, so that further charging of the capacitive storage element 33 is prevented until MOSFET 1 is switched off again.

The second supply voltage circuit 4 of FIG. 2, includes an oscillator circuit 44, a rectifier circuit 46, and a transformer 45 coupled between the oscillator circuit 44 and the rectifier circuit 46. Transformer 45 is, for example, a coreless transformer and has a primary winding connected to the oscillator circuit 44, and a secondary winding connected to the rectifier circuit 46. The oscillator circuit 44 is connected to the enable input 43 and via the enable input 43 receives the control signal Sin. Oscillator circuit 44 is adapted to provide an oscillating output signal to the primary winding of the transformer 45 whenever control signal Sin assumes an on-level. An oscillating voltage applied to the primary winding of the transformer 45 results in an oscillating voltage being available at the secondary winding of the transformer 45. Rectifier circuit 46 is adapted to rectify an oscillating voltage at the secondary winding and to generate the second supply voltage V4 from the voltage at the secondary winding. The oscillator circuit 44 is, for example, a circuit of the first voltage domain, that has voltages that are related to the second reference potential $REF_2$, while the rectifier circuit 46 is, for example, a circuit of the second voltage domain, that has voltages that are related to the third reference potential $REF_3$.

Transformer 45 is suitable for transmitting the oscillating signal provided by the oscillator 44 from the first voltage domain to the second voltage domain, where transmitting the oscillating signal from the first to the second voltage domain is equivalent to transmitting energy from the first to the second voltage domain. When the control signal Sin assumes its on-level, the oscillating voltage transmitted from the oscillator circuit 44 to the rectifier circuit 46 results in the second supply voltage V4 assuming an enable level. When the control signal Sin assumes an off-level oscillator circuit 44 is switched off which results in the second supply voltage V4 assuming the disable-level.

The second supply voltage circuit 4 provides electrical energy to the drive circuit 2 dependent on the control signal it receives at its enable input 43, but independent of the switching state of switch 1. A bootstrap circuit, however, such as bootstrap circuit 33, 34 requires that switch 1 is cyclically switched on and off, in order to supply energy to the capacitive storage element 33. The capacitive storage element 33 is discharged when energy is supplied to the drive circuit 2 when driving switch 1 in its on-state. Due to this a maximum duration for which switch 1 can be switched on would be limited if only the first supply voltage circuit 3 would supply energy to the drive circuit 2. This maximum duration is, for example, given by the charge storage capacity of the storage element 33 and the power consumption of the load. However, due to the presence of the second supply voltage circuit 4 the maximum switch-on duration of switch 1 is not limited, but is only governed by the control signal Sin.

Figure 3:
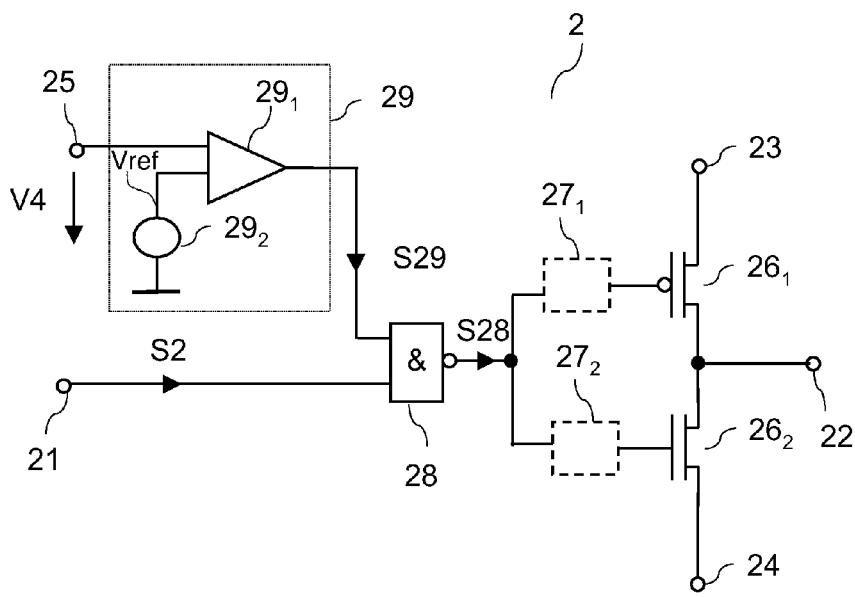
FIG. 3 illustrates a detailed embodiment of the drive circuit.

FIG. 3 illustrates an embodiment of the drive circuit 2. Drive circuit 2 includes a driver stage having a half-bridge with a first and second drive transistor $26_1$, $26_2$ each having a control terminal and a load path, where the load paths of the two transistors $26_1$, $26_2$ are connected between the supply terminals 23, 24. A circuit node common to the load paths of the two transistors $26_1$, $26_2$ forms the output 22 of the driver circuit 2. The two transistors $26_1$, $26_2$ are, for example, complementary transistors, which means, that one of these transistors, such as the upper transistor $26_1$, is a PMOS transistor, while the other transistor, such as the lower transistor $26_2$ is an NMOS transistor. The two transistors $26_1$, $26_2$ are driven by a common drive signal S28 that can assume an on-level and an off-level. An on-level of drive signal S28 generates an on-level of the output drive signal S1 at the output 22, and an off-level of the drive signal S28 generates an off-level of the output drive signal. Assume, for illustration purposes, that the on-level of the output drive signal S1 is a high-level, and that the off-level of the output drive signal S1 is a low-level; such drive signal S1 is suitable for driving an n-MOSFET. Further, assume that the upper transistor $26_1$ is a PMOS transistor, and that the lower transistor $26_2$ is an NMOS transistor. In this case, the on-level of the drive signal S28 is a low-level, that switches the upper transistor $26_1$ on and the lower transistor $26_2$ off, and the off-level of the drive signal S28 is a high-level, that switches the upper transistor $26_1$ off and the lower transistor $26_2$ on.

Optionally, delay circuits $27_1$, $27_2$ are connected downstream the control terminals of the half-bridge transistors $26_1$, $26_2$. These delay circuits $27_1$, $27_2$ are adapted to delay switching on of the transistors, but not to delay switching off of these transistors. In this way a dead-time is inserted between switching off one of the transistors $26_1$, $26_2$ and switching on the other one of the transistors $26_1$, $26_2$, so that cross currents through the half-bridge $26_1$, $26_2$ are prevented.

Drive signal S28 is provided by a logic gate 28, such as a NAND-gate, that has a first input connected to the control input 21 of the drive circuit 2 and thus receives control signal S2. A second input of the logic gate 28 receives an enable signal S29 from an evaluation circuit 29. Evaluation circuit 29 is coupled to the enable input 25 and is adapted to compare the second supply voltage V4 with a reference voltage Vref provided by a reference voltage source $29_2$. A comparator $29_1$ receives second supply voltage V4 at a first input and the reference voltage Vref at the second input and is adapted to provide a first signal level of the enable signal S29 if the second supply voltage V4 is above a threshold level given by the reference voltage Vref, and to generate a second signal level of the enable signal S29 if the supply voltage V4 is below the threshold level given by the reference voltage Vref. The threshold level is a level between the enable and the disable level of the second supply voltage V4, so that the enable signal S29 assumes the first signal level when the voltage level of the second supply voltage is the enable level, and that the enable signal S29 assumes the second signal level when the voltage level of the second supply voltage is the disable level. For explanation purposes it is assumed that the first signal level of the enable signal S29 is a high-level. Logic gate 28 in connection with the driver stage $26_1$, $26_2$ is adapted to generate an on-level of the drive signal S1 only when the control signal S2 assumes an on-level and the enable signal S29 assumes an enable level. This is equivalent to the fact that both signal transmission paths correctly transmit an on-level of the control signal Sin to the drive circuit 2. If only one of the two signal S29, S2 assumes a low-level, an off-level of drive signal S1 is generated.

Figure 4:
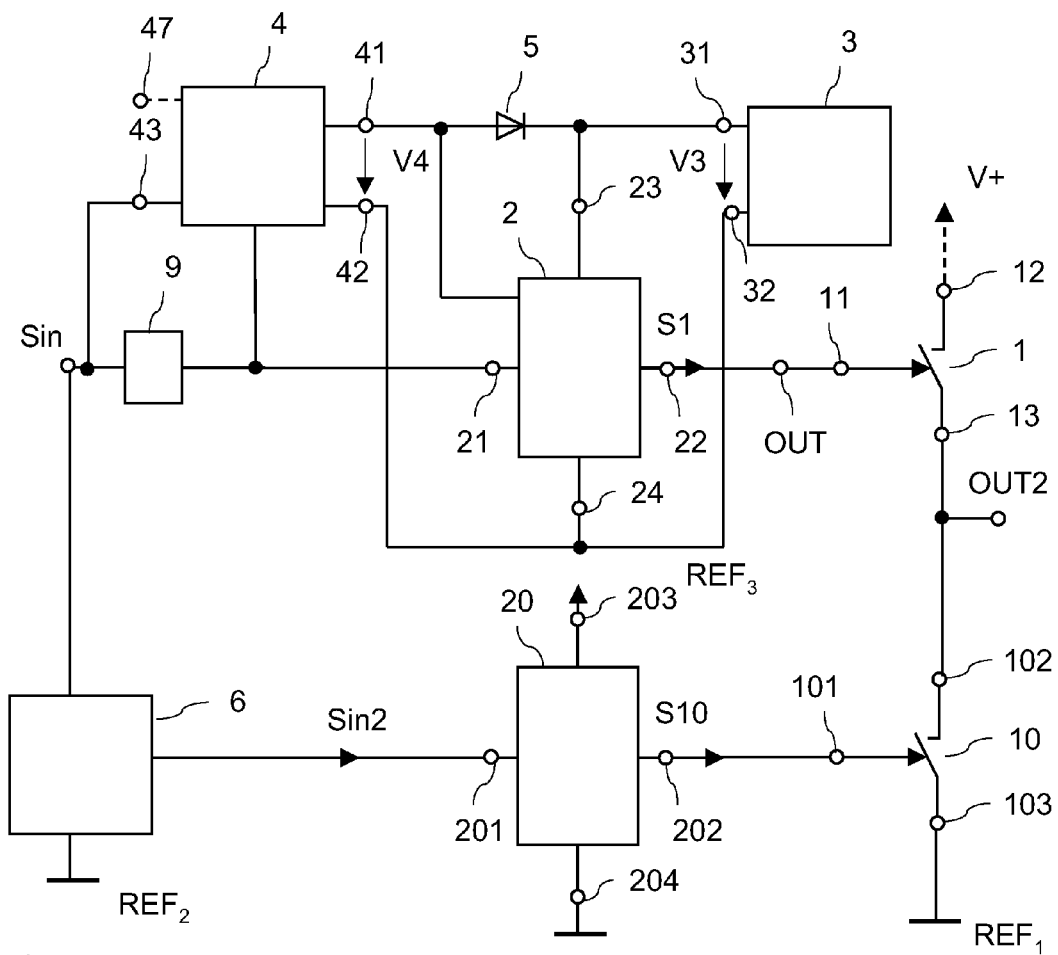
FIG. 4 illustrates a second embodiment of the circuit arrangement.

FIG. 4 illustrates a further embodiment of the circuit arrangement. In this embodiment switch 1 is part of a half-bridge circuit that includes a further switch 10 that has its load path connected in series with the load path of switch 1. A load path of the second switch 10 is a path between a first and a second load path terminal 102, 103 of the second switch 10. For driving the second switch 10 the circuit arrangement includes a second drive circuit 20 that has an input 201 and an output 202, where a drive signal S10 for the second switch 10 is provided at the output 202. The output 202 of the second drive circuit 20 is coupled to a control terminal 101 of the second switch 10. Like the first switch 1, the second switch 10 can be any switch suitable for switching electrical loads, such as a MOS transistor or a bipolar transistor. The half-bridge circuit formed by the two switches 1, 10 has an output OUT2 for connecting a load thereto. The output is a circuit node common to the load paths of the two switches 1, 10.

The second drive circuit 20 is adapted to generate the drive signal S10 for the second switch 10 dependent on a further control signal Sin2. In the embodiment according to FIG. 4 the second control signal Sin2 is also provided by the control circuit 6. The control circuit 6 is adapted to generate the control signal Sin and the further control signal Sin2 such that the first and second switches 1, 10 are not switched on at the same time, thus preventing cross currents through the half-bridge. The second drive circuit 20 further has supply terminals 203, 204 for receiving a supply voltage.

Figure 5:
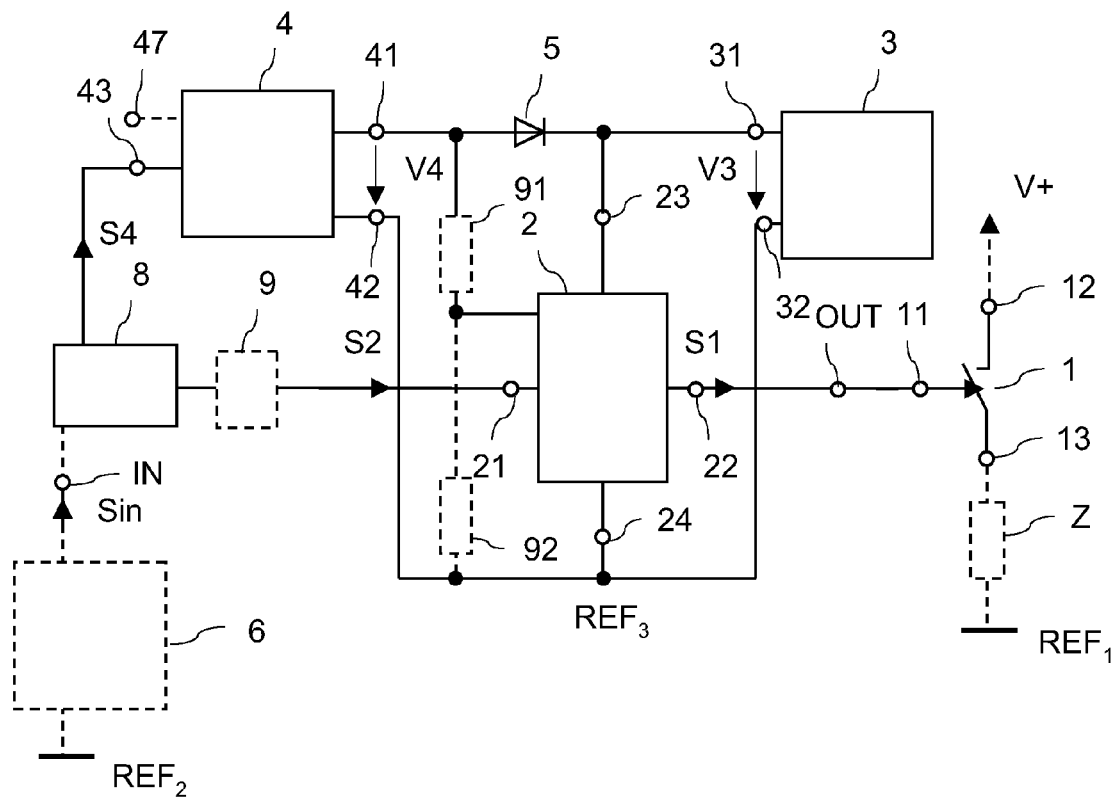
FIG. 5 illustrates a third embodiment of the circuit arrangement.
Figure 6:
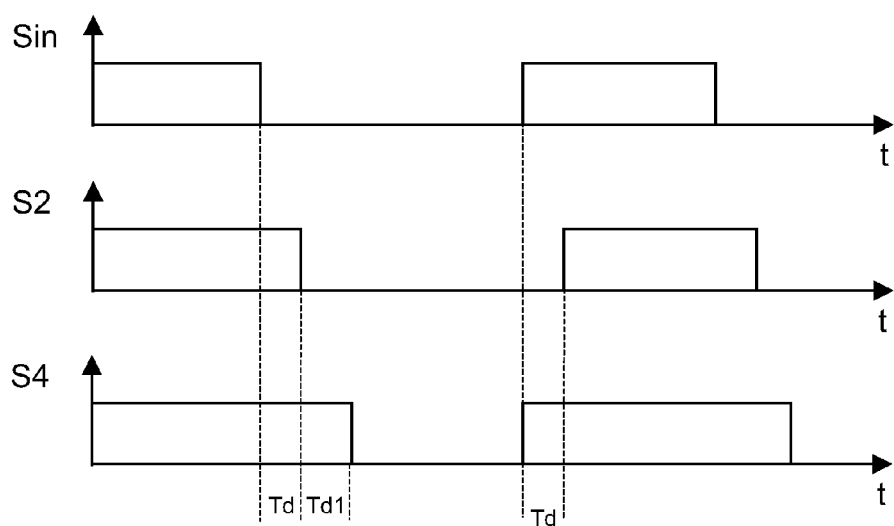
FIG. 6 shows timing diagrams illustrating the operating principle of the circuit arrangement of FIG. 5.

A further embodiment of the circuit arrangement is illustrated in FIG. 5. In this circuit arrangement the control signal S4 received at the enable input of the second supply voltage circuit 4 and the second control signal S2 received at the input of the drive circuit 2 are generated such that there is a time-delay between enabling the second supply voltage source 4 and generating an on-level of the control signal S2 of the drive circuit 2. Optionally, there is also a time-delay between disabling the second supply voltage circuit 4 and generating an off-level of the control signal S2 of the drive circuit 2. The second supply voltage circuit 4 is enabled and disabled dependent on a control signal S4 received at its enable input 43, where this control signal S4 is dependent on the input control signal Sin received at the input IN Assume, for explanation purposes, that a high-level of the control signal S4 enables and that a low-level of the control signal S2 disables the second supply voltage source 4. FIG. 6 illustrates timing diagrams of the control signal S4 received at the enable input 43 of the second supply voltage circuit 4 and of the second control signal S2 received at the control input 21 of the drive circuit 2. Referring to FIG. 5, control signal S2 of the drive circuit 2 is a delayed version of the input control signal Sin. A delay time between the input control signal Sin and control signal S2 is Td in the present example. The input control signal Sin and the control signal S2 have the same duty-cycle. Delay time Td is only required for generating the control signal S4 of the second supply voltage source.

The second supply voltage source 4 is enabled, by a high-level of control signal S4, before control signal S2 assumes an on-level. The information of an upcoming on-level of the control signal S2 is provided by a rising edge of the input control signal. The time delay between enabling the second supply voltage source 4 and the on-level of the control signal S2 is Td in the present example, i.e., equals the time delay between the input control signal Sin and the control signal of the drive circuit 2. However, this time delay could be less than Td. Enabling the second supply voltage source 4 before the control signal S2 of the drive circuit 2 assumes an on-level ensures that a sufficiently high supply voltage is present at the drive circuit 2 at the time at which switching element 1 is to be driven in its on-state, where this time is governed by the time at which the control signal S2 assumes its on-level.

The second supply voltage source 4 can be disabled at the time at which the control signal S2 of the drive circuit 2 assumes its off-level. Optionally, however, the second supply voltage circuit 4 is disabled after a delay-time Td1 after the control signal S2 assumes an off-level. Keeping the second supply voltage source 4 enabled for a while after the control signal S2 assumes its off-level and switching element 1 is, therefore, switched off is useful in those cases in which drive circuit 2 requires energy after switching, switching element 1 off, such as for transferring drive circuit 2 into a defined operation state.

The control signal S2 received by the drive circuit 2 and the control signal S4 received by the second supply voltage source 4 are generated by a delay circuit 8 that receives input control signal Sin in accordance with the timing diagrams of FIG. 6. Delay circuit 8 is adapted to generate control signal S2 to be a time-delayed version of the input control signal Sin. Further, delay circuit 8 is adapted to generate on-levels of the control signal S4 earlier than on-levels of control signal, and is adapted to generate off-levels of control signal S4 with off-levels of control signal S2 or time-delayed relative to off-levels of control signal S2.

In this way the time sequence of switching on and switching off switch 1 is controlled by the control signal S2, if the circuit arrangement is in a normal operation mode in which no errors occur. However, if an error occurs in generating the second control signal S2, such as an error that results in an unintended on-level of the second control signal, then switch 1 is switched off controlled by the second supply voltage circuit 4, namely dependent on the control signal S4.

The second control signal S2 and the further control signal S4 are, for example, generated by a logic circuit 9 dependent on the input control signal Sin. According to the embodiment illustrated in FIG. 6, logic circuit 9 generates the second control signal S2 such that it is a delayed version of the input control signal Sin, having a delay Td. In this case, the second control signal S2 has the same duty-cycle as the input control signal Sin. Further, the logic circuit 9 generates the further control signal S4 such that it assumes an off-level after the first delay-time Td1 after the second control signal assumes its off-level, and such that it assumes its on-level when the input control signal Sin assumes its on-level. In this case the second delay-time Td2 corresponds to the delay-time Td.

Optionally, the second supply voltage source 4 has a further enable input 47 for receiving a safe-stop signal. In this case, the second supply voltage source is adapted to generate a disable level of the second supply voltage each time the enable signal received at the enable input 43 assumes an off-level and each time the safe-stop signal assumes an off-level. The safe-stop signal is, for example, provided by a safety-circuit, such as a circuit including an emergency button for switching the application off in case of an emergency.

Finally it should be mentioned that features that have been disclosed in connection with one embodiment can be combined with features of any other embodiment, even if this has not explicitly been mentioned before.

What is claimed is:

1. A circuit arrangement comprising:
   an input for receiving an input control signal;
   a drive circuit having a control input, an output, supply terminals, and a first enable input, the drive circuit being adapted to generate a drive signal at the output dependent on a signal received at the control input, and dependent on a signal received at the first enable input;
   a first supply voltage circuit adapted to provide a first supply voltage at output terminals, the output terminals being coupled to the supply terminals of the drive circuit;
   a second supply voltage circuit adapted to provide a second supply voltage at output terminals, the output terminals being coupled to the supply terminals of the drive circuit, the second supply voltage circuit having a second enable input, and being adapted to generate the second supply voltage dependent on a signal received at the second enable input;
   wherein the second enable input of the second supply voltage circuit is adapted to receive a signal that is dependent on the input control signal,
   wherein the first enable input of the drive circuit is adapted to receive a signal that is dependent on the second supply voltage, and
   wherein the control input of the drive circuit is adapted to receive a signal that is dependent on the input control signal.

2. The circuit arrangement of claim 1, further comprising a load connected to the output of the drive circuit.

3. The circuit arrangement of claim 2, wherein the load comprises a High-Side switch.

4. The circuit arrangement of claim 1, wherein the first supply voltage circuit comprises a bootstrap circuit.

5. The circuit arrangement of claim 1, wherein the second supply voltage circuit comprises:
   an oscillator circuit coupled to the second enable input and adapted to generate an oscillating signal dependent on the signal received at the second enable input;

a supply voltage generation circuit adapted to provide the second supply voltage;

a transformer coupled between the oscillator circuit and the supply voltage generation circuit.

6. The circuit arrangement of claim 5, wherein the transformer is a coreless transformer.

7. The circuit arrangement of claim 1, further comprising:

a control signal generation circuit coupled to the input and adapted to generate the input control signal.

8. The circuit arrangement of claim 1, further comprising:

a control signal processing circuit adapted to receive the input control signal, to generate a first control signal received at the control input of the drive circuit, and to generate a second control signal received at the second enable input of the second supply voltage circuit.

9. A method of driving a load, comprising:

providing a drive circuit;

providing a first supply voltage to the drive circuit using a first supply voltage circuit, and providing a second supply voltage to the drive circuit using a second supply voltage circuit;

providing a control signal;

driving the load using the drive circuit dependent on the control signal and dependent on a voltage value of the second supply voltage.

10. The method of claim 9, wherein the second supply voltage is generated dependent on the control signal.

* * * * *